(12) United States Patent
Ancey et al.

(10) Patent No.: US 10,186,474 B2
(45) Date of Patent: *Jan. 22, 2019

(54) HEAT PIPE AND METHOD OF MANUFACTURING THE SAME

(71) Applicants: STMICROELECTRONICS SA, Montrouge (FR); STMICROELECTRONICS (CROLLES 2) SAS, Crolles (FR)

(72) Inventors: Pascal Ancey, Revel (FR); Simon Gousseau, Coublevie (FR); Olga Kokshagina, Paris (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/816,990

(22) Filed: Nov. 17, 2017

(65) Prior Publication Data

US 2018/0076114 A1 Mar. 15, 2018

Related U.S. Application Data

(63) Continuation of application No. 14/643,837, filed on Mar. 10, 2015, now Pat. No. 9,953,895.

(30) Foreign Application Priority Data

Mar. 11, 2014 (FR) ..................................... 14 52010

(51) Int. Cl.
*H01L 23/52* (2006.01)
*H01L 23/532* (2006.01)
(Continued)

(52) U.S. Cl.
CPC ............ *H01L 23/427* (2013.01); *F28D 15/04* (2013.01); *F28D 15/046* (2013.01);
(Continued)

(58) Field of Classification Search
CPC .......... F28D 15/04; F28F 13/18; H01L 23/34; H01L 23/3677; H01L 23/373;
(Continued)

(56) References Cited

U.S. PATENT DOCUMENTS

2003/0106671 A1 6/2003 Cho et al.
2006/0071334 A1 4/2006 Kawabata et al.
(Continued)

OTHER PUBLICATIONS

Gillot et al., "Conception et Realisation d'un Caloduc Plat a Rainures en Silicium," [Design and Realization of a Flat Heat Pipe with Grooves in Silicon] SHF Microfluidic Congress, Toulouse, France, Dec. 3-5, 2002, 8 pages. (including 8 pages English translation).

(Continued)

*Primary Examiner* — Brian Turner
(74) *Attorney, Agent, or Firm* — Seed Intellectual Property Law Group LLP

(57) ABSTRACT

A method of manufacturing a heat pipe, including the steps of: forming in a substrate a cylindrical opening provided with a plurality of ring-shaped recessed radially extending around a central axis of the opening; arranging in the recesses separate ring-shaped strips made of a material catalyzing the growth of carbon nanotubes; and growing carbon nanotubes in the opening from said ring-shaped strips.

21 Claims, 3 Drawing Sheets

(51) Int. Cl.
  *H01L 21/768* (2006.01)
  *H01L 29/80* (2006.01)
  *H01L 23/34* (2006.01)
  *H01L 23/427* (2006.01)
  *H01L 23/473* (2006.01)
  *H01L 21/48* (2006.01)
  *H01L 21/3205* (2006.01)
  *H01L 21/3065* (2006.01)
  *H01L 21/02* (2006.01)
  *H01L 23/367* (2006.01)
  *F28D 15/04* (2006.01)
  *F28D 15/02* (2006.01)

(52) U.S. Cl.
  CPC .. *H01L 21/02164* (2013.01); *H01L 21/30655* (2013.01); *H01L 21/32051* (2013.01); *H01L 21/32056* (2013.01); *H01L 21/4803* (2013.01); *H01L 23/367* (2013.01); *H01L 23/473* (2013.01); *F28D 2015/0225* (2013.01); *H01L 2924/0002* (2013.01)

(58) Field of Classification Search
  CPC ........... H01L 23/427; H01L 2924/0002; H01L 2924/00; Y10S 977/742; Y10S 977/72
  See application file for complete search history.

(56) References Cited

U.S. PATENT DOCUMENTS

| | | | |
|---|---|---|---|
| 2006/0278901 A1* | 12/2006 | Dangelo | ............. H01L 23/3677 257/276 |
| 2007/0085198 A1 | 4/2007 | Shi et al. | |
| 2007/0138623 A1 | 6/2007 | Maveety et al. | |
| 2007/0187074 A1 | 8/2007 | Yeh et al. | |
| 2007/0284089 A1 | 12/2007 | Vadakkanmaruveedu et al. | |
| 2008/0169563 A1* | 7/2008 | Awano | ................... B82Y 10/00 257/746 |
| 2009/0056917 A1 | 3/2009 | Majumdar et al. | |
| 2009/0072332 A1 | 3/2009 | Dekker et al. | |
| 2009/0194424 A1* | 8/2009 | Franklin | ................ B01J 23/745 205/114 |
| 2009/0294954 A1 | 12/2009 | Bakir et al. | |
| 2010/0012922 A1 | 1/2010 | Marsh et al. | |
| 2010/0252237 A1 | 10/2010 | Hashimoto et al. | |
| 2010/0284896 A1 | 11/2010 | Arendt et al. | |
| 2011/0146955 A1 | 6/2011 | Chen | |
| 2011/0156245 A1 | 6/2011 | Wu et al. | |
| 2011/0198059 A1 | 8/2011 | Gavillet et al. | |
| 2012/0153502 A1* | 6/2012 | Price | ................. H01L 21/76817 257/774 |
| 2012/0202347 A1 | 8/2012 | Ready et al. | |
| 2012/0322268 A1 | 12/2012 | Kim et al. | |
| 2014/0205829 A1* | 7/2014 | Misra | ..................... B82Y 30/00 428/221 |
| 2015/0307348 A1* | 10/2015 | Liang | .................. B81C 1/00285 257/9 |

OTHER PUBLICATIONS

"Innovation Capillaries Etched in silicon" *Usine Nouvelle*, 2003, 1 page. (with English translation).

Zhang et al., "Investigation of Nanopillar Wicking Capabilities for Heat Pipes Applications," Proceedings of the ASME 2009 2$^{nd}$ Micro/Nanoscale Heat & Mass Transfer International Conference, Shanghai, China, Dec. 18-21, 2009, 15 pages.

* cited by examiner

HEAT PIPE AND METHOD OF MANUFACTURING THE SAME

BACKGROUND

Technical Field

The present disclosure relates to a heat pipe and to a method of manufacturing this heat pipe. It more specifically aims at a miniature heat pipe capable of performing heat transfers inside of an integrated circuit chip or of a stack of integrated circuit chips.

Description of the Related Art

A heat pipe is a device capable of transferring heat from a hot surface to a cold surface, by using liquid-vapor phase changes of a fluid.

Conventionally, a heat pipe comprises a tight enclosure enclosing a fluid. In operation, one side of the enclosure is placed in the vicinity of a hot source, for example, an electronic device which is desired to be cooled, and an opposite side of the enclosure is placed in the vicinity of a cold source, for example, a heat sink. In the hot area of the heat pipe, the fluid vaporizes, thus storing heat. The vapor thus formed diffuses through the enclosure all the way to the cold area of the heat pipe, and then condenses in the cold area, thus releasing heat. Once in the liquid state, the fluid returns to the hot area of the heat pipe by capillary action along the enclosure walls, and the cycle resumes.

Existing heat pipes are capable of substantially uniformly cooling a relatively large surface, for example, the whole surface of an integrated circuit chip or of a stack of integrated circuit chips. However, due to their rather significant bulk, existing heat pipes are not capable of transferring heat between specific local areas of an integrated circuit chip or of a stack of integrated circuit chips.

A miniature heat pipe, which is easy to form and may for example be used to remove heat from local hot areas of an integrated circuit chip or of a stack of integrated circuit chips is thus needed.

BRIEF SUMMARY

Thus, an embodiment provides a heat pipe manufacturing method, comprising the steps of: a) forming in a substrate a cylindrical opening provided with a plurality of ring-shaped recesses radially extending around a central axis of the opening; b) arranging in the recesses separate ring-shaped strips made of a material that catalyzes the growth of carbon nanotubes; and c) growing carbon nanotubes in the opening from said ring-shaped strips.

According to an embodiment, step a) comprises alternating between anisotropic etch steps and of passivation steps.

According to an embodiment, the anisotropic etch steps are carried out by means of an $SF_6$ plasma, and the passivation steps are carried out by means of a $C_4F_8$ plasma.

According to an embodiment, step b) comprises a step of depositing, on the walls of the opening, a continuous layer of a material catalyzing the growth of carbon nanotubes, and a step of focused isotropic etching of a portion of this layer located outside of the recesses.

According to an embodiment, the catalyzing material comprises iron or aluminum.

According to an embodiment, the method further comprises, before step b), a step of depositing, on the walls of the opening, an intermediate layer made of a bonding material for said catalyst material.

According to an embodiment, the material of the intermediate layer is further capable of making the walls of the opening tighter.

According to an embodiment, the intermediate layer is made of silicon oxide.

According to an embodiment, the method further comprises, after step c), a step of densification of the carbon nanotubes.

According to an embodiment, the densification step comprises a step of soaking the carbon nanotubes in a solution containing a solvent, followed by an evaporation of the solvent.

According to an embodiment, the method further comprises, after step c), a step of partially filling the opening with a heat-transfer liquid, followed by a step of tight closing of the opening.

Another embodiment provides a heat pipe comprising: a cylindrical opening arranged in a substrate, said opening being provided with a plurality of ring-shaped recessed radially extending around a central axis of the opening; separate ring-shaped strips made of a material catalyzing the growth of carbon nanotubes, located in the recesses; and carbon nanotubes extending in the opening from said ring-shaped strips.

According to an embodiment, the heat pipe further comprises a heat-transfer liquid partially filling the opening.

According to an embodiment, the heat pipe comprises at least one cap tightly closing the opening.

Another embodiment provides an integrated circuit chip comprising at least one heat pipe of the above-mentioned type.

The foregoing and other features and advantages will be discussed in detail in the following non-limiting description of specific embodiments in connection with the accompanying drawings.

DETAILED DESCRIPTION

Figure 1A:
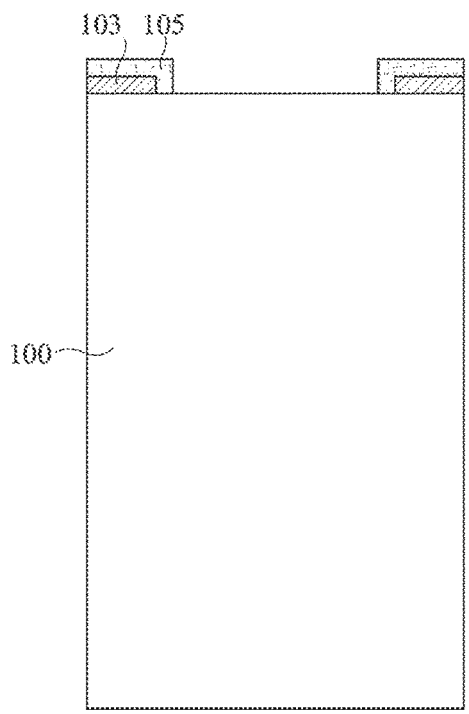
FIGS. 1A to 1H are cross-section views schematically illustrating steps of a manufacturing method of an embodiment of a heat pipe.

For clarity, the same elements have been designated with the same reference numerals in the various drawings and, further, the various drawings are not to scale. Further, in the following description, unless otherwise indicated, terms "approximately", "substantially", "around", "in the order of", and "almost" mean "to within 10%", and terms referring to directions, such as "vertical", "horizontal", "lateral", "under", "above", "upper", "lower", etc., apply to devices arranged as illustrated in the cross-section views of the corresponding drawings, it being understood that, in practice, the devices may have different orientations.

FIGS. 1A to 1H are cross-section views schematically illustrating steps of an example of a heat pipe manufacturing method.

FIG. 1A illustrates a step of depositing, on an upper surface of a substrate 100 where the heat pipe is desired to be formed, a first mask 103 defining an opening leaving the upper surface of substrate 100 apparent and a second mask 105 covering mask 103 as well as the periphery of the upper surface region of substrate 100 which is not coated with mask 103. The apparent region of substrate 100 which is not coated with mask 105 for example has a substantially circular shape. As an example, mask 103 defines a circular opening, and mask 105 defines a circular opening centered on the opening of mask 103 but having a smaller diameter. Other shapes of opening of masks 103 and 105 may however be provided. As a non-limiting example, substrate 100 is a substrate made of a semiconductor material, for example, mask 103 is a metal mask, and mask 105 is a resin mask.

Figure 1B:
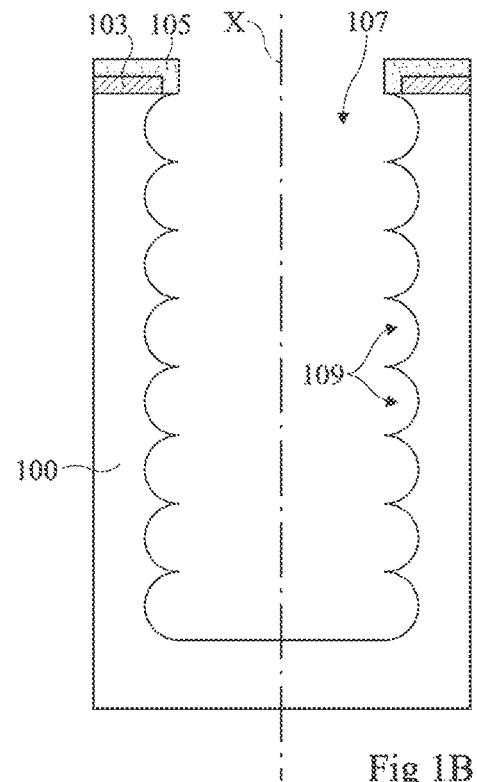

FIG. 1B illustrates a step of forming, in an upper portion of substrate 100, an opening 107 extending from the upper surface region of substrate 100 which is not coated with masks 103 and 105 towards the lower surface of the substrate, for example, along an approximately vertical general direction. As appears in FIG. 1B, opening 107 has corrugated or wavy lateral walls, defining in substrate 100 a plurality of substantially parallel ring-shaped recesses 109, radially extending around a central axis X of the opening. To obtain this wavy shape of opening 107, alternating between anisotropic etch steps and of steps of passivation of the walls of the already etched portion of the opening may for example be carried out. As an example, the anisotropic etch steps are performed by DRIE (Deep Reactive Ion Etching), by means of a plasma based on $SF_6$, and the passivation steps are carried out by means of a plasma based on $C_4F_8$. Any other etch method enabling to obtain the desired corrugations may however be used.

As a non-limiting example, opening 107 has a total height or depth in the range from 10 to 1,000 μm and an average diameter in the range from 2 to 250 μm, and each recess 109 has a height in the range from 100 to 500 nm and a width or thickness (distance from the bottom of the recess to the outlet of the recess on the cylindrical central portion of opening 107) in the range from 30 to 300 nm. The described embodiments are however not limited to these specific examples of dimensions.

In the shown example, the etch conditions are selected so that, as shown in FIG. 1B, ring-shaped recesses 109 emerge onto the cylindrical central portion of opening 107 at the level of the inner edge of mask 105 or between the inner edge of mask 105 and the inner edge of mask 103. In other words, in this example, the etch conditions are selected so that the smallest diameter of ring-shaped recesses 109 is smaller than the diameter of the opening defined by mask 103, and greater than or equal to the diameter of the opening defined by mask 105. As a non-limiting example, the smallest diameter of ring-shaped recesses 109 is smaller by from 10 to 500 nm than the diameter of the opening defined by mask 103.

Figure 1C:
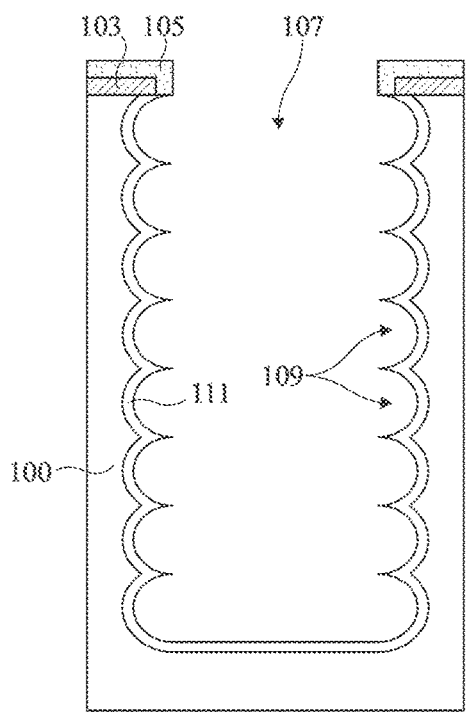

FIG. 1C illustrates an optional step of forming a layer 111 on the lateral walls and on the bottom of opening 107. A function of layer 111 may be to be used as a bonding layer for the subsequent deposition of a catalyzing material for the growth of carbon nanotubes, in the case where substrate 100 would not be itself made of a material capable of receiving such a catalyst. Further, opening 107 being intended to contain a heat-transfer liquid of the heat pipe, layer 111 may have the function of sealing the walls of opening 107 in the case where substrate 100 would not be itself made of a sufficiently fluid tight material. As a non-limiting example, layer 111 is made of silicon oxide. Layer 111 is for example formed by oxidation of the lateral walls and of the bottom of opening 107, or by any other adapted deposition method, for example, by PVD (Physical Vapor Deposition). Layer 111 for example has a thickness in the range from 10 to 150 nm. The thickness of layer 111 is selected so that the material of layer 111 does not totally fill recesses 109.

Figure 1D:
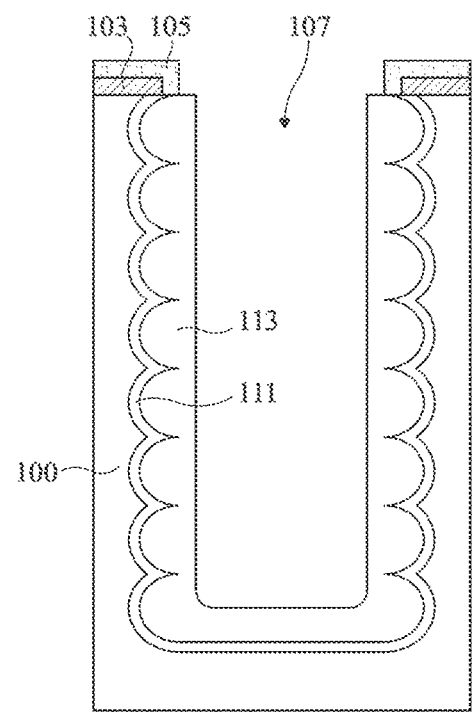

FIG. 1D illustrates a step, subsequent to the forming of layer 111, if present, of depositing a layer 113 made of a material for catalyzing the growth of carbon nanotubes on the lateral walls of opening 107. As an example, layer 113 contains iron, aluminum, or any other material capable of being used as a basis for the growth of carbon nanotubes. Layer 113 may be deposited by sputtering of a source of the catalyzing material by means of an electron beam, or by any other adapted deposition method. The thickness of layer 113 is preferably selected to be sufficiently large for the material of layer 113 to totally fill recesses 109 or the portion of recesses 109 which is not filled with layer 111, when present.

Figure 1E:
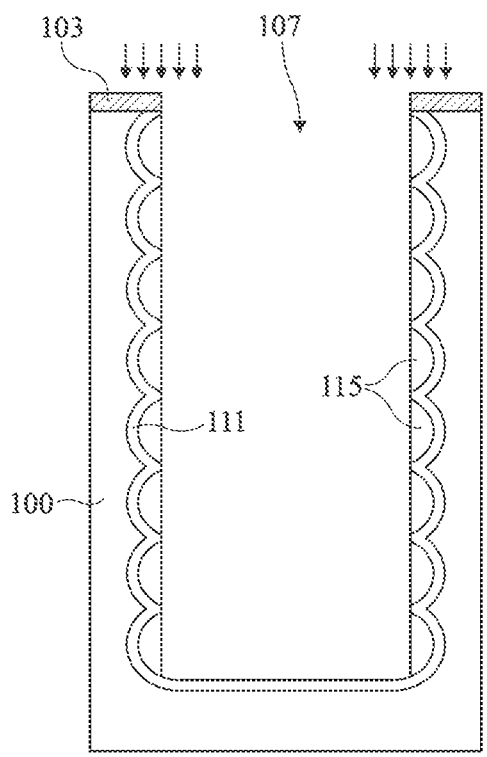

FIG. 1E illustrates a step subsequent to the deposition of layer 113, during which mask 105 is removed, while mask 103, which has a wider opening, is kept. After the removal of mask 105, an isotropic etch step, substantially vertical in this example, is implemented to remove, from the lateral walls of opening 115, the portions of layer 113, of layer 111, and/or of substrate 100, which are not coated with mask 103. The portion of layer 113 covering the bottom of opening 107 is also removed. The isotropic etching of FIG. 1E may be implemented by means of a focused plasma, or by any other adapted etch method. At the end of this etching, as appears in FIG. 1E, the material catalyzing the growth of carbon nanotubes forms approximately parallel separate rings 115, arranged in recesses 109. Each ring or ring portion or ring-shaped strip 115 of the material catalyzing the growth of carbon nanotubes is insulated from the adjacent rings 115 by a portion of layer 111. After this step, mask 103 may be removed.

Figure 1F:
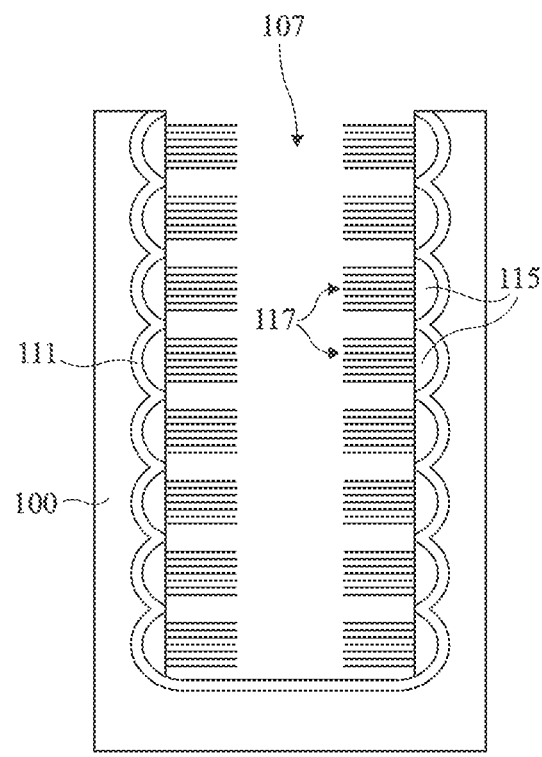

FIG. 1F illustrates a step during which carbon nanotubes are grown from the surface of rings 115 facing the inside of opening 107. The carbon nanotube growth may be performed by CVD (Chemical Vapor Deposition) at a temperature in the range from 550 to 700° C., or by any other adapted method. As schematically shown in FIG. 1F, the carbon nanotubes grow along a general direction approximately orthogonal to the surface of the catalyzing material, that is, along an approximately horizontal general direction in this example. Thus, from the inner surface of each ring 115, there forms a ring 117 made of a cluster of carbon nanotubes. The length of the carbon nanotubes, which defines the width of rings 117, is selected so that rings 117 do not totally close the openings of rings 115. As a non-limiting example, the width of rings 117 is smaller than half the radius of the opening of rings 115. The width of rings 117 is for example in the range from 1 to 50 μm.

As will be explained in further detail hereafter, carbon nanotube rings 117 are intended to enable a heat-transfer fluid in liquid form to displace by capillarity along the lateral walls of opening 107.

Figure 1G:
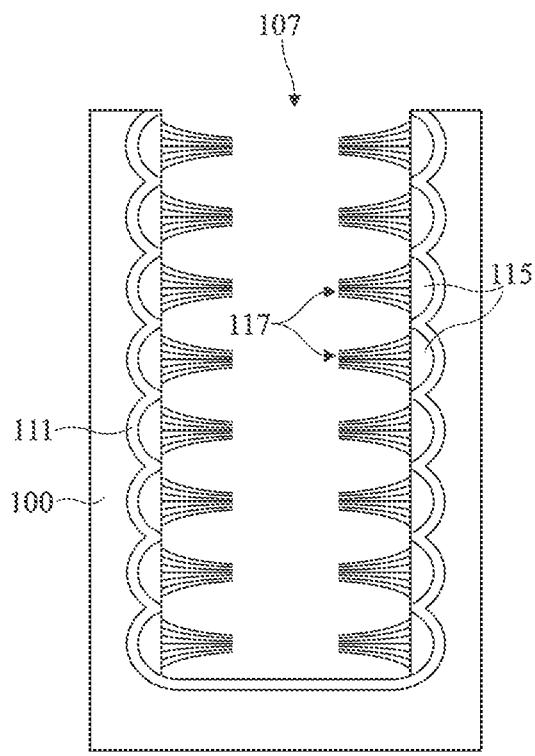

FIG. 1G illustrates an optional step of densification of rings 117 of carbon nanotubes, particularly aiming at improving the capacity of rings 117 to convey a liquid by capillarity. During this step, rings 117 may be soaked, for example, by dipping, with a solution containing a solvent, for example, isopropanol. The evaporation of the solvent after the dipping causes a densification of rings 117.

Figure 1H:
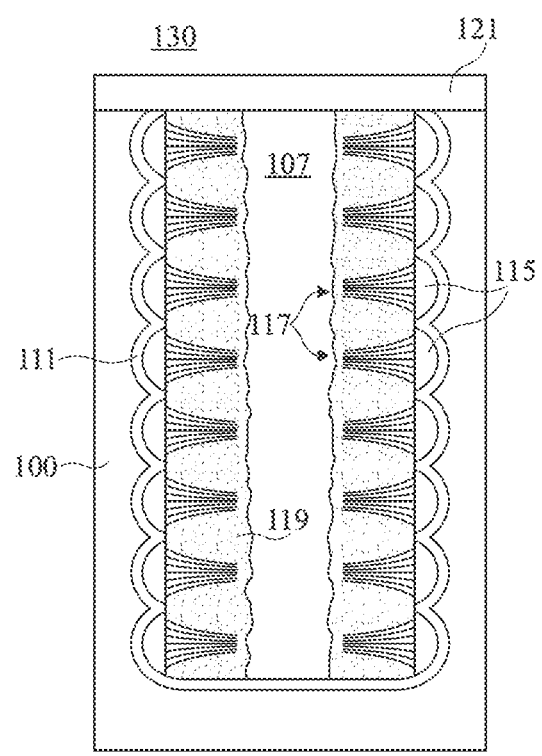

FIG. 1H illustrates a step subsequent to the forming of carbon nanotubes, during which a heat-transfer liquid 119, for example, water or any other adapted liquid, is placed in opening 107 to partially, but not totally fill opening 107. As an example, substrate 100 is dipped into a bath containing liquid 119, and then taken out. As it comes out of the bath, substrate 100 is placed in such a way that the open surface of the substrate faces downwards, so that opening 107 empties part of liquid 119 that it contains. Only part of liquid 119 trapped by carbon nanotubes 117 then remains confined in opening 117.

A cap 121 is then placed on the open surface (the upper surface in the orientation of the drawing) of substrate 100, to tightly close opening 107. As a non-limiting example, cap 121 may be a rigid plate or a polymer, glued to the upper surface of the substrate, a filling paste spread on the upper surface of the substrate, a tight film glued to the upper surface of the substrate, etc. As a variation, cap 121 may directly be a heat source, for example, an integrated circuit chip or any other element to be cooled, or a cold source, for example, a heat sink.

A heat pipe 130 having the following operation is thus obtained. One side of the enclosure formed by opening 107, for example, the upper portion of the enclosure, is placed in the vicinity of or in contact with a hot source, and an opposite side of the enclosure, for example, the lower portion of the enclosure, is placed in the vicinity of or in contact with a cold source. In the hot portion of the heat pipe, that is, in its upper portion in this example, fluid 119 vaporizes, thus storing heat. The vapor thus formed diffuses through enclosure 107, mainly via the enclosure area free of carbon nanotubes, all the way to the cold portion of the heat pipe, that is, its lower portion in this example. In the cold area of the heat pipe, the fluid condenses, thus releasing heat. Once in the liquid state, the fluid returns to the hot area by capillarity along the enclosure walls, due to the presence of carbon nanotube rings 117, after which the cycle resumes.

An advantage of the described embodiments is that they enable to form a heat pipe in a particularly simple way, and in particular in a way compatible with usual integrated circuit manufacturing techniques and tools.

Another advantage is that the heat pipes thus formed may easily be integrated in an integrated circuit chip or in a stack of integrated circuit chips, for example, next to, under, or above components capable of dissipating heat. As a non-limiting example, a plurality of heat pipes of the above-described type may be integrated in a same substrate to form a cooling device intended to be arranged in contact with an integrated circuit chip capable of dissipating heat, or between two chips of a stack of integrated circuit chips.

Figure 2:
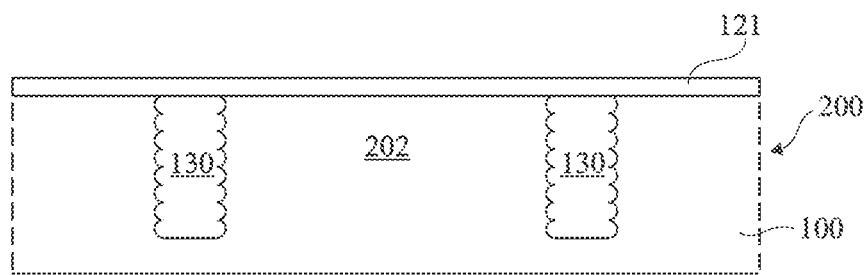
FIG. 2 is a cross-section view schematically and partially illustrating an embodiment of an integrated circuit chip comprising a heat pipe.

FIG. 2 schematically and partially illustrates an example of an integrated circuit chip 200 comprising a substrate 100, for example, made of silicon. Chip 200 comprises, inside and/or on top of a region 202 of the substrate, components (not shown) capable of generating heat. Chip 200 further comprises, integrated in substrate 100 in the vicinity of active region 202, heat pipes 130 of the type described in relation with FIGS. 1A to 1H. An advantage is that heat pipes 130 may be placed as close as possible to active region 202 of the substrate, and thus efficiently cool the heat generation components.

Figure 3:
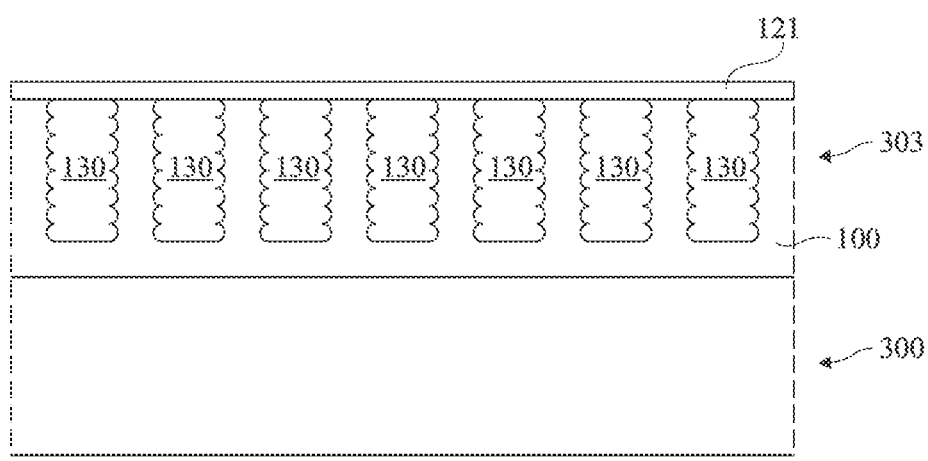
FIG. 3 is a cross-section view schematically and partially illustrating an embodiment of a system comprising an integrated circuit chip and a cooling system comprising a heat pipe.

FIG. 3 schematically and partially illustrates an example of a system comprising an integrated circuit chip 300 and, placed against a surface of chip 300, a cooling device 303 comprising a substrate 100, for example, made of silicon, having a large number of heat pipes 130 of the type described in relation with FIGS. 1A to 1H formed therein.

Specific embodiments have been described. Various alterations, modifications, and improvements will readily occur to those skilled in the art.

In particular, the described embodiments are not limited to the above-described method example enabling to arrange the separate ring-shaped strips of a material catalyzing the growth of carbon nanotubes, in ring-shaped recesses, along the lateral walls of an opening formed in a substrate. More generally, any other method providing a structure of the type illustrated in FIG. 1E may be used.

Further, the described embodiments are not limited to the above-mentioned examples where opening 107 has a generally cylindrical shape with a circular cross-section. Other opening shapes may be provided, for example, cylindrical shapes with a hexagonal cross-section, a square cross-section, an oval cross-section, etc.

Further, in the above-describe examples, opening 107 formed at the step of FIG. 1B does not entirely cross substrate 100. The lower portion of substrate 100 then closes the lower portion of the heat pipe. The described embodiments are however not limited to this specific case. As a variation, it will be within the abilities of those skilled in the art to adapt the described method to the case where opening 107 formed at the step of FIG. 1B is a through opening. In this case, an additional step of closing the lower surface of the heat pipe with a cap may particularly be provided.

Further, it will readily occur to those skilled in the art that the described embodiments may be combined with other known cooling or heat transport devices.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing a heat pipe, the method comprising:
   in a substrate of semiconductor material, forming an opening with a plurality of ring-shaped recesses radially extending around a central axis of the opening, the ring-shaped recesses being vertically stacked along the central axis;
   in the recesses, arranging a plurality of ring-shaped strips made of a material configured to catalyze growth of carbon nanotubes; and
   growing carbon nanotubes in the opening from the ring-shaped strips towards the central axis, wherein after growing, the carbon nanotubes have end surfaces facing the central axis.

2. The method of claim 1, wherein forming the opening with the plurality of ring-shaped recesses comprises alternating between anisotropic etch steps and passivation deposition steps.

3. The method of claim 2, wherein the anisotropic etch steps are carried out by an $SF_6$ plasma etch, and the passivation steps are carried out by a $C_4F_8$ plasma deposition.

4. The method of claim 1, wherein the opening is delimited by walls and a bottom surface of the substrate, wherein arranging the plurality of ring-shaped strips comprises depositing, on the walls of the opening, a continuous layer of a material configured to catalyze growth of carbon nanotubes, the method further comprising focused isotropic etching of a portion of the continuous layer located outside of the recesses.

5. The method of claim 4, wherein the continuous layer includes iron or aluminum.

6. The method of claim 1, further comprising, prior to arranging the plurality of ring-shaped strips, depositing, on walls of the opening, an intermediate layer made of a bonding material for the catalyst material.

7. The method of claim 6, wherein the bonding material of the intermediate layer is a fluid tight material.

8. The method of claim 6, wherein the intermediate layer is made of silicon oxide.

9. The method of claim 1, further comprising, after growing the carbon nanotubes, densifying the carbon nanotubes.

10. The method of claim 9, wherein densifying the carbon nanotubes comprises soaking the carbon nanotubes in a solution containing a solvent and evaporating the solvent.

11. The method of claim 1, further comprising, after growing the carbon nanotubes, partially filling the opening with a heat-transfer liquid and closing the opening.

12. The method of claim 1, wherein the substrate includes an active area, wherein the heat pipe is located in the substrate and configured to remove heat from the active area.

13. A heat pipe comprising:
a substrate of semiconductor material;
an opening in the substrate, the opening having a plurality of ring-shaped recesses radially extending around a central axis of the opening, each of the ring-shaped recesses being vertically arranged along the central axis;
ring-shaped strips made of a material configured to catalyze growth of carbon nanotubes and arranged in the recesses; and
carbon nanotubes having longitudinal lengths extending in the opening from the ring-shaped strips towards the central axis, wherein the longitudinal lengths of the carbon nanotubes are substantially perpendicular to the central axis.

14. The heat pipe of claim 13, further comprising a heat-transfer liquid partially filling the opening.

15. The heat pipe of claim 13, comprising at least one cap closing the opening in a fluid tight manner.

16. The heat pipe of claim 13, wherein the substrate includes an active area, wherein the heat pipe is located in the substrate and configured to remove heat from the active area.

17. A heat pipe comprising:
a substrate of semiconductor material, the substrate including an active area; and
at least one heat pipe located in the substrate and configured to remove heat from the active area, the at least one heat pipe including:
an opening delimited by sidewalls and a bottom surface of the substrate, the sidewalls having a plurality of ring-shaped recesses, each of the ring-shaped recesses extending radially around a central axis of the opening, the ring-shaped recesses being vertically stacked along the central axis;
a catalyzing material located in each of the ring-shaped recesses; and
carbon nanotubes extending from the ring-shaped strips towards the central axis.

18. The heat pipe of claim 17, further comprising a heat-transfer liquid partially filling the opening.

19. The heat pipe of claim 17, further comprising at least one cap closing the opening in a fluid tight manner.

20. The heat pipe of claim 17, comprising a plurality of heat pipes located in the substrate, each of the plurality of heat pipes being configured to remove heat from the active area.

21. The heat pipe of claim 17, further comprising a silicon oxide layer in the ring-shaped recesses located between the substrate and the catalyzing material, wherein the catalyzing material located in each of the ring-shaped recesses is separated from each other by the intermediate layer.

* * * * *